United States Patent
Bogner et al.

(10) Patent No.: US 8,174,034 B2
(45) Date of Patent: May 8, 2012

(54) OLED WITH COLOR CONVERSION

(75) Inventors: Elif Arici Bogner, Linz (AT); Ralph Paetzold, Roth (DE); Arvid Hunze, Erlangen (DE); Karsten Heuser, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 24 days.

(21) Appl. No.: 12/527,655

(22) PCT Filed: Feb. 26, 2008

(86) PCT No.: PCT/DE2008/000341
§ 371 (c)(1),
(2), (4) Date: Nov. 12, 2009

(87) PCT Pub. No.: WO2008/104164
PCT Pub. Date: Sep. 4, 2008

(65) Prior Publication Data
US 2010/0084674 A1   Apr. 8, 2010

(30) Foreign Application Priority Data

Feb. 27, 2007 (DE) .......................... 10 2007 009 530

(51) Int. Cl.
*H05B 33/00* (2006.01)
(52) U.S. Cl. .................................. 257/89; 257/E51.022
(58) Field of Classification Search .................... 257/89, 257/103, E51.022; 313/512; 977/774
See application file for complete search history.

(56) References Cited

U.S. PATENT DOCUMENTS

| | | | |
|---|---|---|---|
| 6,608,439 B1 * | 8/2003 | Sokolik et al. | 313/512 |
| 6,803,719 B1 | 10/2004 | Miller et al. | |
| 6,914,265 B2 | 7/2005 | Bawendi et al. | |
| 2006/0197437 A1 | 9/2006 | Krummacher et al. | |
| 2007/0176539 A1 | 8/2007 | Mathai et al. | |
| 2007/0182316 A1 | 8/2007 | Mathai et al. | |
| 2007/0194694 A1 * | 8/2007 | Reddy | 313/503 |
| 2007/0221947 A1 * | 9/2007 | Locascio et al. | 257/103 |
| 2008/0174233 A1 | 7/2008 | Bawendi et al. | |

FOREIGN PATENT DOCUMENTS

| | | |
|---|---|---|
| EP | 1 705 728 A2 | 9/2006 |
| EP | 1 731 583 A1 | 12/2006 |
| EP | 1 816 690 A2 | 8/2007 |
| WO | WO 99/50916 | 7/1999 |

(Continued)

OTHER PUBLICATIONS

Van Sark, W.G.J.H.M., et al., "Improvement of Spectral Response of Solar Cells by Deployment of Spectral Converters Containing Semiconductor Nanocrystals," Semiconductors, vol. 38, No. 8, Aug. 2004, 4 pages.

(Continued)

*Primary Examiner* — Thomas L Dickey
(74) *Attorney, Agent, or Firm* — Slater & Matsil, L.L.P.

(57) ABSTRACT

An OLED is thus specified which includes a layer construction comprising at least an anode, a cathode and a functional layer arranged in between, the layer construction being arranged on a substrate. At least one electrode, selected from the anode and cathode, is transmissive to the light emitted by the functional layer and is arranged on the light-emitting side, emission side, of the layer construction. The at least one color conversion layer has quantum dots and is arranged on the emission side above or below the layer construction.

6 Claims, 2 Drawing Sheets

FOREIGN PATENT DOCUMENTS

| | | |
|---|---|---|
| WO | WO 00/17903 | 3/2000 |
| WO | WO 01/66997 A2 | 9/2001 |
| WO | WO 2007/051499 A1 | 5/2007 |

OTHER PUBLICATIONS

Talapin, D., et al., "Highly Luminescent Monodisperse CdSe and CdSe/ZnS Nanocrystals Synthesized in a Hexadecylamine-Trioctylphosphine Oxide-Trioctylphosphine Mixture," Nano Letters, vol. 1, No. 4, Mar. 2001, pp. 207-211. American Chemical Society.

"Quantum Dot," Wikipedia, http://en.wikipedia.org/w/index.php?title=Quantum dot&oldid=107869625, last revised Feb. 13, 2007, 7 pages.

* cited by examiner

OLED WITH COLOR CONVERSION

This patent application is a national phase filing under section 371 of PCT/DE2008/000341, filed Feb. 26, 2008, which claims the priority of German patent application 10 2007 009 530.0, filed Feb. 27, 2007, each of which is incorporated herein by reference in its entirety.

TECHNICAL FIELD

The invention relates to an organic light-emitting diode, OLED, having a color conversion layer for converting a radiation of a first wavelength that is primarily generated by the OLED into radiation and, in particular, into light of a second, longer wavelength, such as can be used, in particular, as a lighting element or as a display.

BACKGROUND

The use of color conversion layers is a known method for generating a spectrum of a desired light color or light color mixture from the usually monochromatic radiation that is primarily generated by the OLED. An aim here may be to generate white light and, in particular, light approximated to daylight, which is best suited for lighting purposes.

For LEDs, color conversion layers are known which contain a colorant that is dispersed into a polymer layer and is able to absorb the primary radiation of the LED and to generate a longer-wave secondary radiation. By means of a combination of three color conversion layers having suitably chosen emission wavelengths of the secondary radiation or colorants suitable for this, an approximation to daylight is possible by color mixing of the emission wavelengths. In this case, the thickness of the individual color conversion layers and the concentration of the colorants dispersed therein also have to be selected in a suitable manner.

For the use of these known color conversion layers in OLEDs, however, it is disadvantageous that with their colorants and the polymer matrix, further sensitive material is incorporated into the OLED, which further reduces the lifetime of these components or accelerates the reduction of the luminous intensity as a result of decomposition of the organic constituents. Furthermore, different aging of the different color conversion layers leads to a prematurely commencing undesirable color variation of the resulting total spectrum emitted.

SUMMARY

In one aspect, the present invention specifies an OLED having a color conversion layer which avoids the disadvantages mentioned.

An OLED is proposed which has at least one color conversion layer containing quantum dots.

Quantum dots have the advantage that they are inorganic and generally insensitive to moisture and oxygen. They have a defined emission wavelength which is not subject to aging and is also photochemically stable. They have the further advantage over color conversion layers with colorants that they have a significantly wider absorption band with respect to primary radiation and absorb practically all shorter-wave radiation lying in the range of blue OLEDs. Furthermore, quantum dots are simple to process and during production can be trimmed and set as desired with regard to their emission wavelength and also with regard to the width of their emission band. They are also simple to process and commercially available.

An OLED is thus specified which comprises a layer construction comprising at least an anode, a cathode and a functional layer arranged in between, the layer construction being arranged on a substrate. At least one electrode, selected from the anode and cathode, is transmissive to the light emitted by the functional layer and is arranged on the light-emitting side, emission side, of the layer construction. The at least one color conversion layer has quantum dots and is arranged on the emission side above or below the layer construction.

The at least one color conversion layer contains at least one type of quantum dots, that advantageously comprises three quantum dots that differ with regard to their emission wavelength. These emission wavelengths can be chosen so that their added total emission spectrum is approximated to white light. OLEDs well suited to lighting purposes are obtained in this way.

The quantum dots can be dispersed in a transparent matrix comprising, e.g., an organic polymer. However, it is also possible for the quantum dots present as nanoparticles or as a suspension of nanoparticles to be used directly for the layer production of the color conversion layer. For mechanical protection, the nanoparticles of the color conversion layer can be provided with a covering, which can comprise a polymer layer, a film or a solid transparent material.

The substrate carrying the layer construction can be transparent and arranged on the emission side. In this case, it is possible and advantageous to provide the color conversion layer directly on the substrate. This can be on the side of the substrate facing the layer construction or on the side opposite to the layer construction. The latter option has the advantage that no direct contact is made between electrodes or functional layers of the OLED and the color conversion layer and it is also possible for the color conversion layer not to be applied until after the production of the layer construction, such that it need not be exposed to the layer applying conditions, in particular, of the transparent electrode.

It is also possible for the emission side to correspond to the side of the layer construction opposite to the substrate, and for the color conversion layer to be arranged on the transparent electrode. This is unproblematic since the layer production of the color conversion layer comprising quantum dots can be effected at room temperature and carried out in such a way that there is no damage to the layer construction and, in particular, to any of the organic functional layers.

It is advantageous to provide and, in particular, to encapsulate the OLED on the emission side with a covering and to apply the color conversion layer on the covering. This can be effected prior to the encapsulation optionally on the inner side or the outer side of the covering or after the encapsulation only on the outer side.

A substrate and/or a covering advantageously comprise a glass layer. Glass has the advantage that it is transparent to emitted radiation, cost-effective, easily processable, diffusion-tight and sufficiently mechanically stable. At least one of the substrate and covering can, if appropriate, additionally comprise further layers and be formed, for example, as a multilayer laminate. At least one of the substrate and covering is at least partly transmissive to the light emitted by the OLED.

The substrate, particularly if it is not arranged on the emission side of the layer construction, can be, however, any desired solid, if appropriate even flexible, material.

Conversely, the OLED can be applied on almost any curved surfaces. However, it can also be a component that can be handled individually.

The OLED can be scaled in a continuously variable manner to a substrate area of any desired size. The plan can be configured as desired and be adapted to a given use. It can assume a geometrically regular form such as e.g. a rectangle, polygon, circle, or can be arbitrarily irregular.

Between the covering and substrate a cavity can be included above or alongside the light-emitting active area of the OLED, a gettering material being arranged in the cavity. The gettering material is chosen such that in the event of moisture penetrating and/or oxygen penetrating, it can prevent damage to the light-emitting element or the OLED or at least delay it over a longer period of time. The gettering material must therefore be suitable for the absorption or binding of oxygen and/or moisture and is selected accordingly.

It is also possible for the gettering material to be provided directly onto the layer construction without a cavity.

The covering can span the layer construction in a self-supporting manner and be connected to the substrate only outside the active region of the OLED, e.g., by means of a sealant or adhesive.

In the case of relatively large active areas, the covering can also be supported on the layer construction. In this case, the entire active area can be used for support. On the layer construction, an adhesive layer or a sealant or an insulating material can also be applied over the whole area and be adhesively bonded to the covering.

It is also possible, however, to provide at least one supporting element having a smaller basic area between layer construction and covering. Advantageously, at least in the region of the at least one supporting element, a buffer layer is provided between the supporting element and layer construction, the buffer layer being formed, in particular, in soft or elastic fashion with a low modulus of elasticity in order to avoid damage to the layer construction as a result of the supporting forces acting on it.

BRIEF DESCRIPTION OF THE DRAWINGS

The invention is explained in more detail below on the basis of exemplary embodiments and the associated figures. The figures serve solely for illustrating the invention and have been drawn up only schematically and not as true to scale.

DETAILED DESCRIPTION OF ILLUSTRATIVE EMBODIMENTS

Figure 1:
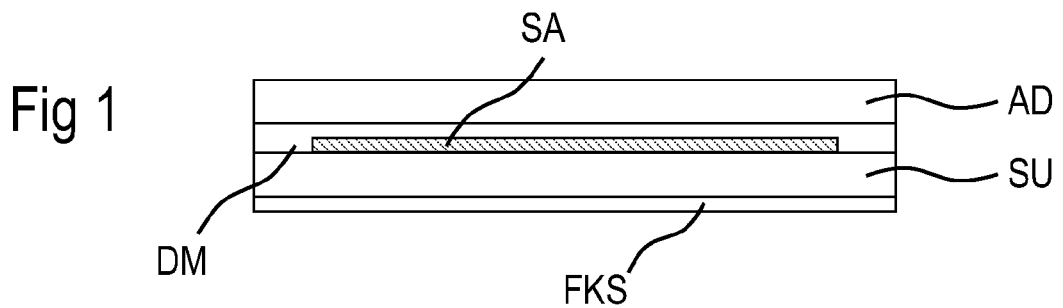
FIGS. 1 to 7 show various OLEDs having a color conversion layer.

FIG. 1 shows an OLED known per se, which is constructed as a layer construction SA on a substrate SU. With the aid of a sealant DM, a covering AD is arranged above the OLED, wherein the layer construction SA is covered by the sealant DM. In addition, the OLED has a color conversion layer FKS (FIG. 2) applied directly on the underside of the substrate SU, which is formed in transparent fashion here and therefore constitutes the light-emitting side.

Figure 2:
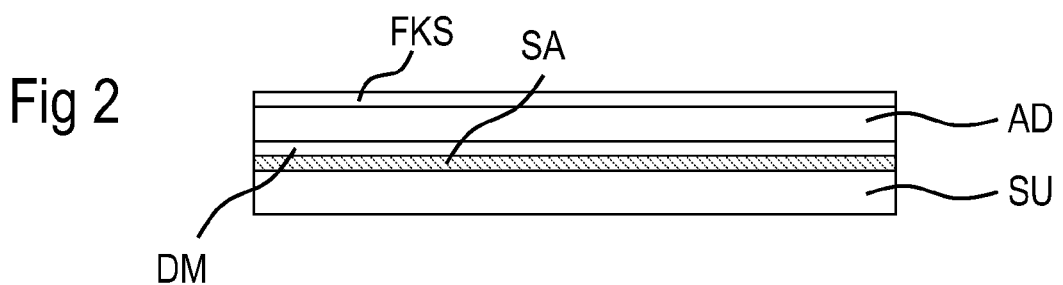

FIG. 2 shows a similar OLED, in which, in contrast to FIG. 1, the color conversion layer FKS is applied on the covering AD, which is transparent here and constitutes the light-emitting side.

Figure 3:
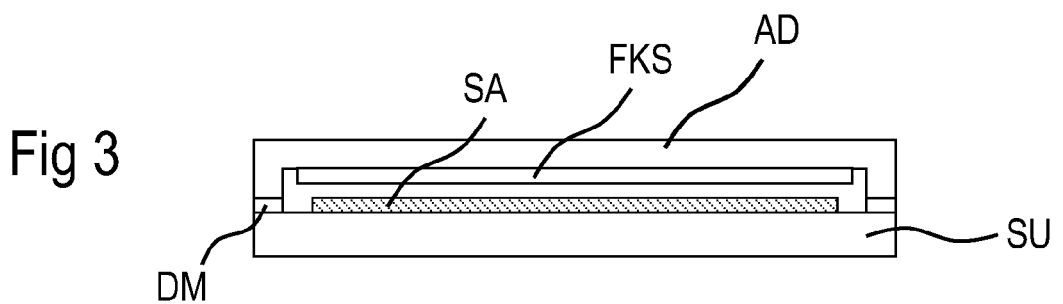

FIG. 3 shows a further device known per se, in which the covering AD is formed in cap-like fashion and covers the layer construction SA without contact. The sealant DM is restricted here to the bearing region of the covering AD on the substrate SU. A gettering material GE (FIG. 4) can be applied on the inner side of the covering AD. In addition, the color conversion layer FKS is arranged on the top side of the covering AD, which is formed in transparent fashion here.

Figure 4:
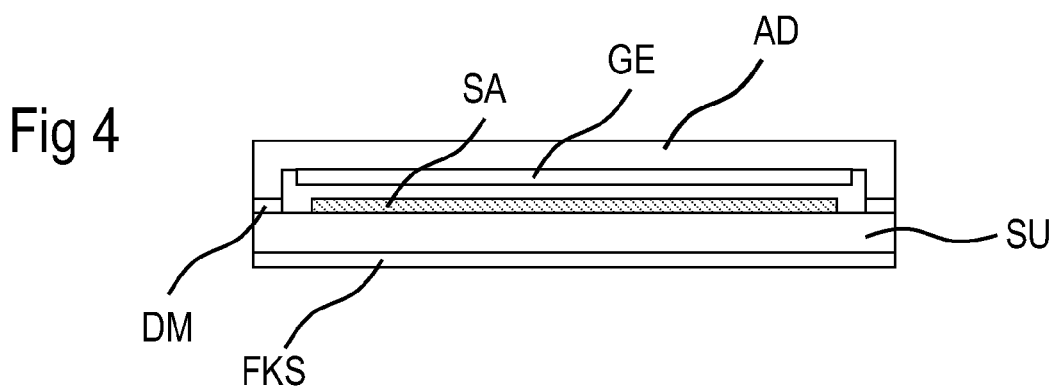

FIG. 4 shows an OLED which is formed in a manner similar to that in FIG. 3 and in which, in contrast to FIG. 3, the color conversion layer FKS is arranged on the underside of the substrate SU, wherein the substrate is transparent here and constitutes the light-emitting side. A gettering material GE can be applied on the inner side of the covering AD, which encloses a cavity above the layer construction SA.

Figure 5:
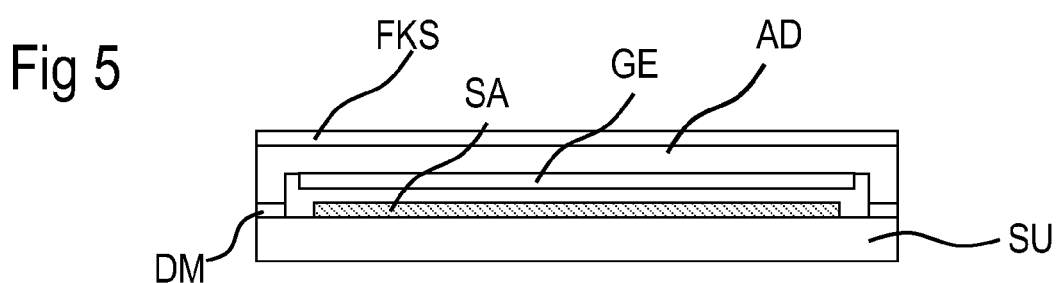

FIG. 5 shows an OLED with is formed in a manner similar to that in FIG. 4 and in which, in contrast to FIG. 3, the color conversion layer FKS is arranged on the top side of the covering AD, which is transparent here and constitutes the light-emitting side. A gettering material GE can also be applied on the inner side of the covering AD.

Figure 6:
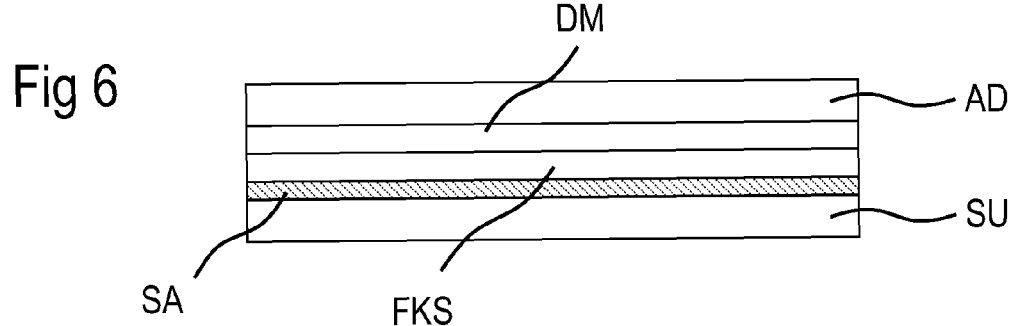
Figure 7:
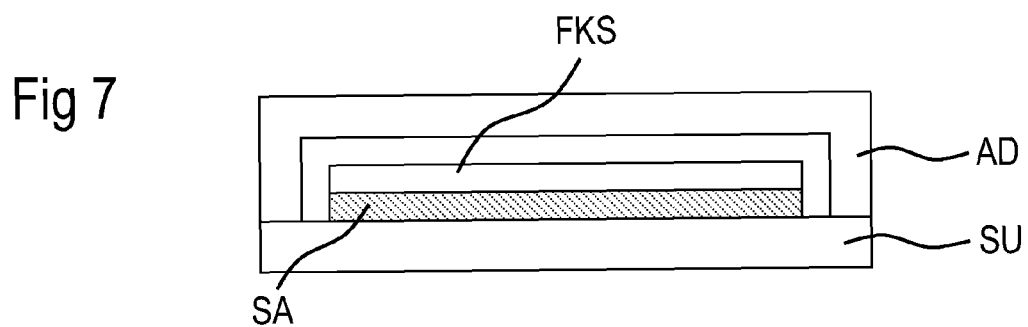

FIG. 6 and FIG. 7 show an OLED in which the color conversion layer FKS is applied directly to the layer construction SA. FIG. 6 shows a covering AD bearing directly on the color conversion layer FKS, while FIG. 7 shows a cavity enclosing the layer construction SA below the covering. A sealing or adhesion-promoting layer (not illustrated) can also be provided between color conversion layer FKS and covering AD in a construction in a manner similar that in FIG. 6.

Figure 8:
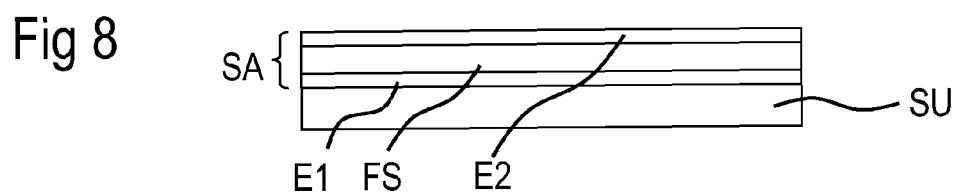
FIGS. 8 and 9 show possible layer constructions for the OLED.

FIG. 8 shows a possible construction of an OLED that is known per se. The OLED has a layer construction SA, which can have an organic functional layer FS or a layer sequence having at least one organic layer, with an active region that can emit electromagnetic radiation during operation. This is a layer which contains at least one colorant or in rare cases is only composed of a colorant.

Furthermore, the OLED can have a first electrode E1 applied on the substrate SU, and a second electrode E2 on the layer construction SA, wherein the functional layer(s) with the active region can be arranged between the first and the second electrodes. Preferably, the first electrode E1 bearing on a transparent substrate SU constitutes the anode, while the second electrode E2, which is not necessarily embodied in transparent fashion, constitutes the cathode.

The electrodes can have a single continuous basic area which corresponds to the basic area of the OLED and which can already be driven by a respective electrical lead, such that the OLED can emit light with its entire active area (basic area).

It is also possible, however, to divide either only one or both electrodes into smaller partial areas by structuring. These partial areas can then also be electrically driven individually. However, it is also possible to structure the entire layer construction of the OLED in order to obtain the desired corresponding partial areas.

An OLED structured into individually driveable partial areas can also have partial areas with different color conversion layers. It is thus possible, alongside uniformly emissive areas, also to produce colorful overall areas from a plurality of differently emissive partial areas, the overall areas making it possible to represent images, symbols and patterns.

A transparent first electrode E1, which can be embodied as an anode and can therefore serve as a material that injects positive charges or "holes", can, for example, comprise a transparent conductive oxide or be composed of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds, such as, for example, $ZnO$, $SnO_2$ or $In_2O_3$, ternary metal-oxygen compounds, such as, for example, $Zn_2SnO_4$, $CdSnO_3$, ZnSnO$_3$, MgIn$_2$O$_4$, GaInO$_3$, Zn$_2$In$_2$O$_5$ or In$_4$Sn$_3$O$_{12}$, or mixtures of different transparent conductive oxides, also belong to the group of TCOs. Furthermore, the TCOs need not necessarily correspond to a stoichiometric composition and can also be p- or n-doped. As an alternative or in addition, the first electrode can also comprise a metal, for example, silver.

A non-transparent cathode can be composed of a metal or alloy having a low electron work function and comprise, for example, aluminum, barium, ruthenium, indium, silver, gold, magnesium, calcium or lithium, and compounds, combinations and alloys thereof.

The layer construction SA illustrated in FIG. 8 can also be inverted, such that the first electrode E1 constitutes the non-transparent cathode and the second electrode E2 constitutes the transparent anode on the emission side.

The first and second electrodes E1, E2 inject "holes" and electrons, respectively, into the active region, which can recombine there with the formation of an excited state. The energy thereof is then transferred to the colorant of the functional layer FS, the colorant then undergoing transition to an electronically excited state. The colorant then undergoes transition to a state having a lower energy level or the ground state with emission of electromagnetic radiation or light.

Figure 9:
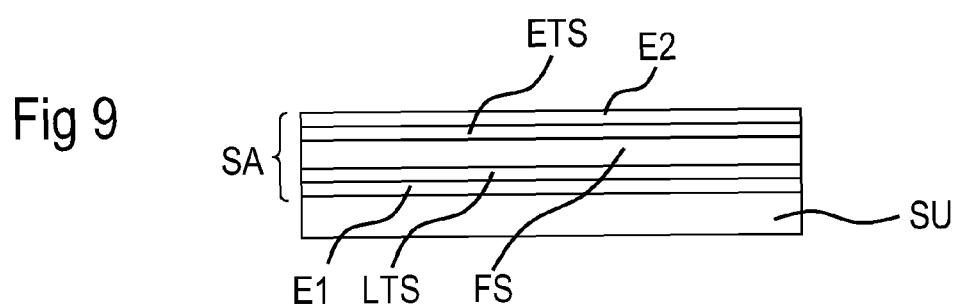

FIG. 9 shows a further refined layer construction SA, wherein a hole conducting layer LTS is arranged between anode (first electrode E1) and functional layer FS and an electron transporting layer or an electron injecting layer ETS is arranged between functional layer and cathode (second electrode E2). A further layer can be provided between function layer FS and hole conducting layer LTS and serve for lowering the injection barrier for holes.

As a protective layer and for reducing the injection barrier for electrons, a thin layer of LiF or CsF can also be vapour-deposited between cathode and electron transporting layer ETS.

Figure 10:
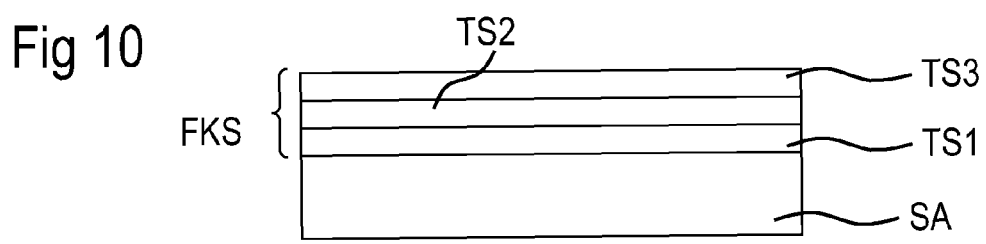
FIG. 10 shows a layer construction with a color conversion layer comprising partial layers.

FIG. 10 shows a possible construction of a color conversion layer FKS composed of a plurality of partial layers. The color conversion layer FKS, which is arranged, e.g., directly above or below the layer construction SA here comprises a first partial layer TS1 having a quantum dot that emits in the red range. A second partial layer TS2 arranged above (or below) the first partial layer TS1 has an orange emitting quantum dot. The third partial layer TS3 arranged above (or below) the second partial layer TS2 has a green emitting quantum dot.

The partial layers TS of the color conversion layer FKS can be applied as a dispersion in a polymeric matrix, which cures if appropriate after application. It is also possible, however, to apply the nanoparticles of the quantum dots as a suspension in a solvent, such that after evaporation of the solvent a pure nanoparticle layer remains which can constitute a partial layer.

The dispersion or suspension can be applied by spinning-on. In this case, the dispersivity of the nanoparticles in the matrix or in the solvent is a function of the surface into which the quantum dots are embedded. By way of example, quantum dots embedded in triphenyl phosphate are soluble in acetonitrile, while quantum dots embedded in tri-n-octylphosphine are soluble or dispersible in a non-polar matrix or such a solvent. Toluene, for example, is suitable.

By means of spinning-on as an application method, the required number of partial layers TSn (n>1) can be safely applied directly one above another without a lower partial layer TSn−1 being damaged in the process.

The quantum dots have a nanoscopic structure and are usually composed of semiconductor material (e.g., InGaAs, CdSe, or else GaInP/InP). The charge carriers (electrons, holes) in a quantum dot are restricted in all three spatial directions to an extent such that their energy can no longer assume continuous values, but rather only discrete values. The energy or the difference between discrete energy levels of the quantum dot determines the emission wavelength of the quantum dot.

In this case, the emission wavelength of the quantum dot is a function of the size of the quantum dot. It can exhibit a narrow Gaussian emission band having a maximum at 520 nm, e.g., for CdSe nanoparticles having a diameter of 2 nm. The same nanoparticle having a diameter of 6 nm, by contrast, exhibits an emission maximum at 640 nm. That is to say that the quantum dots can be produced in a manner tailored towards a specific emission wavelength. This is a further advantage over color conversion layers with colorants, where for each partial layer it is necessary first to find the correct colorant appropriate for the wavelength, that is to say, e.g., three different colorants which then also absorb differently.

Given a narrow particle size distribution of the quantum dots in a partial layer (carrier substrate), it is possible to obtain a narrow emission band with the partial layer, which has, e.g., an FWHM (full width at half maximum) of less than 40 nm.

The absorption spectrum of the quantum dots, by contrast, depends on their diameter to only a small extent, such that all the different quantum dots in the partial layers TS of the color conversion layer FKS can be excited at the same wavelength. The excitation wavelength is preferably selected in the blue range at approximately 300 to 450 nm, just because blue can be converted into all other longer-wave colors by means of a color conversion layer.

The thickness of the color conversion layer FKS or of each of its partial layers TS can easily be set by the parameters of the spinning-on method, such that it is also possible to exactly set and obtain a desired mixed color from the individual emission wavelengths of the partial layers.

The invention, which has been described only on the basis of a few exemplary embodiments, is not restricted to the embodiments illustrated. Rather, it is possible to combine individual features illustrated in individual figures with features illustrated in other figures. The precise embodiment of the layer construction SA, the covering AD, the type and configuration of the substrate SU, and the size relationships can deviate from the embodiments illustrated in the figures. Insofar as material indications were made with regard to the individual elements of the OLED according to the invention, they are nevertheless not binding. In particular, it is possible to use the corresponding known materials for individual components of the device, insofar as these correspond to known devices.

The OLED can be used such that it is emissive predominantly with white mixed color, for lighting purposes. However, the color conversion layer or the partial layers thereof can also produce a different resulting light color, such that it is also possible to produce, e.g., decorative applications and display representations using the OLED. With a structured OLED having individually driveable partial areas that emit different light colors generated by means of different color conversion layers, it is also possible to obtain colorful and animated light effects.

The invention claimed is:
1. An organic light emitting diode (OLED) comprising:
a functional layer having an emission side to emit light;
a first electrode dispersed adjacent the emission side of the functional layer, the first electrode transmissive to the light;

a second electrode disposed adjacent a second side of the functional layer so that the functional layer is arranged between the first electrode and the second electrode;

a color conversion layer arranged adjacent the emission side of the functional layer, the color conversion layer containing quantum dots, wherein a cavity is formed between the color conversion layer and the functional layer;

a substrate carrying the functional layer, first electrode and second electrode; and a covering layer, wherein the functional layer is arranged between the substrate and the covering layer, and the color conversion layer is applied to the covering layer or a surface facing the functional layer.

2. The OLED according to claim 1, wherein the color conversion layer is arranged between the first electrode and the functional layer.

3. The OLED according to claim 1, wherein the first electrode is arranged between the color conversion layer and the functional layer.

4. The OLED according to claim 1, wherein a total emission spectrum of light emitted through the color conversion layer is approximated to white light.

5. The OLED according to claim 4, wherein the color conversion layer contains different types of quantum dots.

6. The OLED according to claim 1, wherein the color conversion layer comprises:

at least three partial layers arranged one above the other, the partial layers respectively containing a type of quantum dots having an emission wavelength allocated on the type, wherein the quantum dots in the at least three partial layers of the color conversion layer have different emission wavelengths.

\* \* \* \* \*